March 10, 1970 TSUGIO MAKIMOTO ET AL 3,500,140
MULTICHANNEL INTEGRATED DEVICES CONSISTING OF DARLINGTON CIRCUITS
Filed June 5, 1968 4 Sheets-Sheet 1
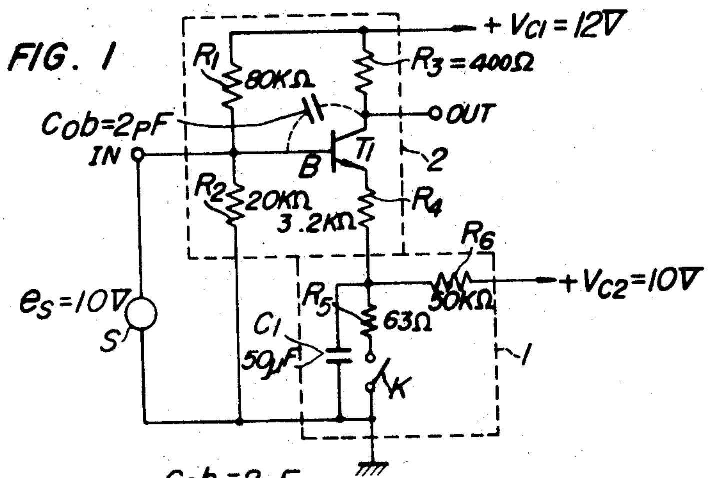
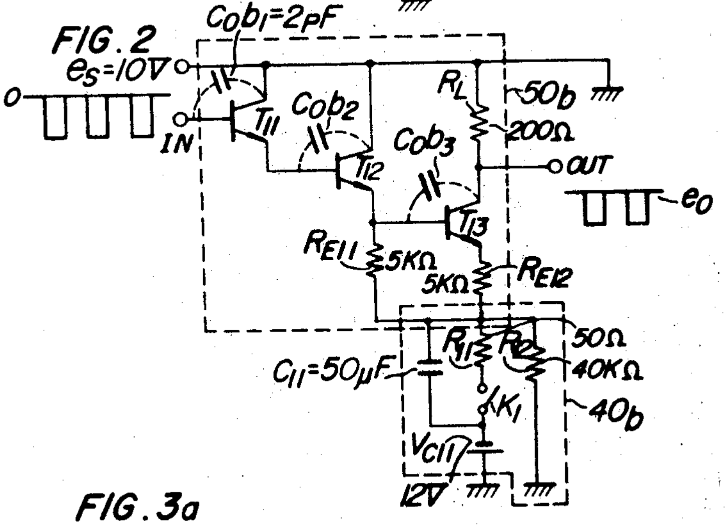
FIG. 1
FIG. 2
FIG. 3a
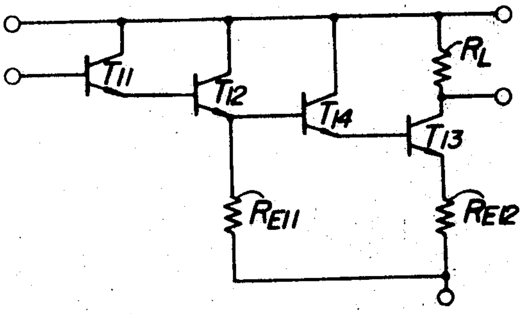
INVENTORS
TSUGIO MAKIMOTO
YUICHI TERANISHI
TUGUYUKI WATANABE
BY Craig & Antonelli
ATTORNEYS INVENTORS
TSUGIO MAKIMOTO
YUICHI TERANISHI
TUGUYUKI WATANABE
BY Craig & Antonelli
ATTORNEYS

INVENTORS
TSUGIO MAKIMOTO
YUICHI TERANISHI
TUGUYUKI WATANABE

BY Craig & Antonelli
ATTORNEYS

INVENTORS
TSUGIO MAKIMOTO
YUICHI TERANISHI
TUGUYUKI WATANABE

BY Craig & Antonelli
ATTORNEYS

United States Patent Office 3,500,140

Patented Mar. 10, 1970

3,500,140

MULTICHANNEL INTEGRATED DEVICES CONSISTING OF DARLINGTON CIRCUITS

Tsugio Makimoto, Kodaira-shi, Yuichi Teranishi, Akishima-shi, and Tuguyuki Watanabe, Kunitachi-shi, Japan, assignors to Hitachi, Ltd., Tokyo, Japan, a corporation of Japan Filed June 5, 1968, Ser. No. 734,765

Claims priority, application Japan, June 19, 1967, 42/38,848

Int. Cl. H01l *11/00;* H03k *3/00, 3/26*

U.S. Cl. 317—235 7 Claims

ABSTRACT OF THE DISCLOSURE

A switching device for a musical instrument comprising as gating circuits a plurality of collector separated type Darlington circuits, where in a semiconductor body having first and second electrically separated semiconductor regions a plurality of first transistors are incorporated in said first semiconductor region with their collectors connected in common and a plurality of second transistors are formed in said second semiconductor region with their collectors connected in common.

Figure 3B:
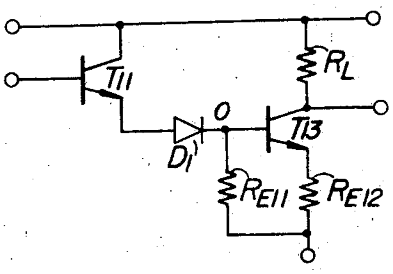

This invention relates to a minute switching device used in an electronic musical instrument, etc.

Generally, it is practiced in an electronic musical instrument such as an electronic organ to push a key arranged on a keyboard to operate a switching device electrically connected thereto and to select a tone signal having a desired music scale out of a tone generator generating a multiplicity of tone signals.

According to a prior art technique, a switching device comprises by switches and a multiplicity of gating circuits corresponding to the number of key switches. Each gating circuit is combined with a resistance-capacitance timing network to give a continuous attenuating effect, or sustain effect, to the output signal of the circuit. By the switching action of a key switch a gate of the gating circuit is switched, obtaining a desired tone signal between a pair of output terminals of the circuit. The tone signal generated from the tone generator is a rectangular wave electric signal having a prescribed frequency, which after being selected by the above-mentioned switching device in accordance with the will of the performer passes through a filter circuit or mixes with another tone signal to be processed as a tone resembling that of a musical instrument. The signal having a processed wave-form is amplified by an amplifier and applied to an electro-acoustic transducer such as a speaker. Thus a desired tone of instrument is obtained.

Therefore, the switching device has an important role in an electronic organ and requires sufficient reliability. It is desirable that the device be small and easily manufactured in mass production as it contains a large number of gating circuits.

One object of this invention is to provide a novel switching device having a good electrical characteristic, improvement being made specifically in regard to the reduction of the leakage signal.

Another object of this invention is to provide a switching device comprising an integrated semiconductor device.

Still another object of this invention is to provide an improved solid switching device with high reliability comprising gate circuits and being excellent if used for an electronic musical instrument.

A further object of this invention is to provide a very small switching device being easily manufactured in mass production.

According to one embodiment of this invention, a switching device comprising a semiconductor body having first and second semiconductor regions electrically insulated from each other; a plurality of first transistors formed in said first region with their collector regions connected in common; a plurality of second transistors formed in said second region with their collector regions connected in common, the number being equal to that of the first transistors; first conducting means for connecting the emitter regions of the first transistors to the corresponding base regions of the second transistors; input means connected to the base regions of the first transistors; second conducting means connected to the common collector region of the first transistors to lead it to a reference voltage point; third conducting means connected to the emitter regions of the first and second transistors to connect them to means for giving a bias voltage to them; and fourth conducting means connected to the common collector region of the second transistors to connect it to a load resistor is provided. The means for giving a bias voltage to the emitters of first and second transistors consists of a switching means, a timing network and a voltage source. When this switching means is open, the PN junction between each emitter and base of the first group of transistors is given a reverse bias, and the second group of transistors are given a bias to make their gains zero. When the switching means is closed, said PN junction is given a forward bias, and the second group of transistors are given a bias to have a prescribed gain. The timing network delays the conversion of the bias state of each emitter of the first and second transistors by a prescribed transient period depending on a prescribed time constant when the switching means is converted from the closed to the open state. Thus, a desired output signal is obtained across the load resistor in accordance with the action of the switching means.

The above and other objects and features of this invention will be made more apparent from the following description taken in conjunction with the accompanying drawings, in which;

FIG. 1 is a circuit diagram showing a gating circuit contained in a switching device of a prior art electronic musical instrument.

FIGS. 2, 3*a*, to 3*c*, and 4 respectively show a circuit arrangement exemplifying a gating circuit adopted in one embodiment of this invention.

Figure 5A:
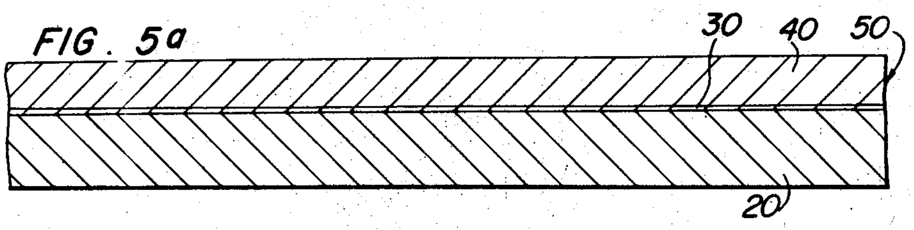
Figure 5B:
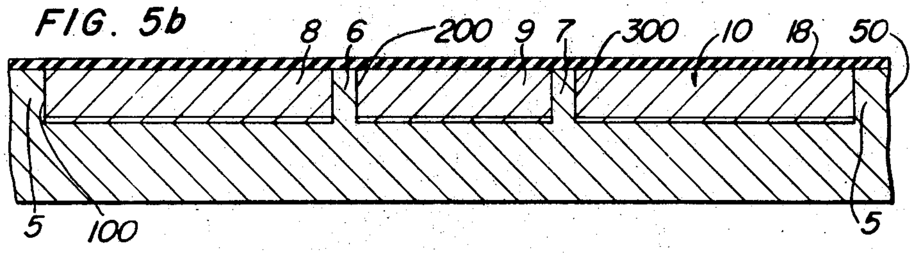
Figure 5C:
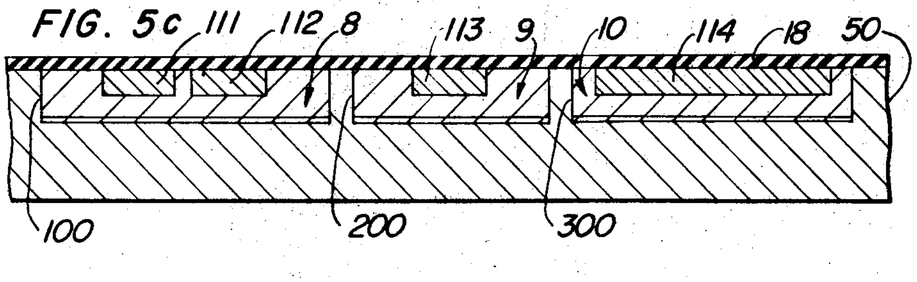
Figure 5D:
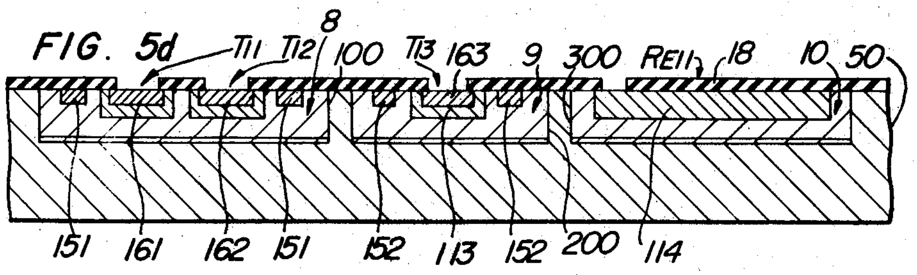
Figure 6:
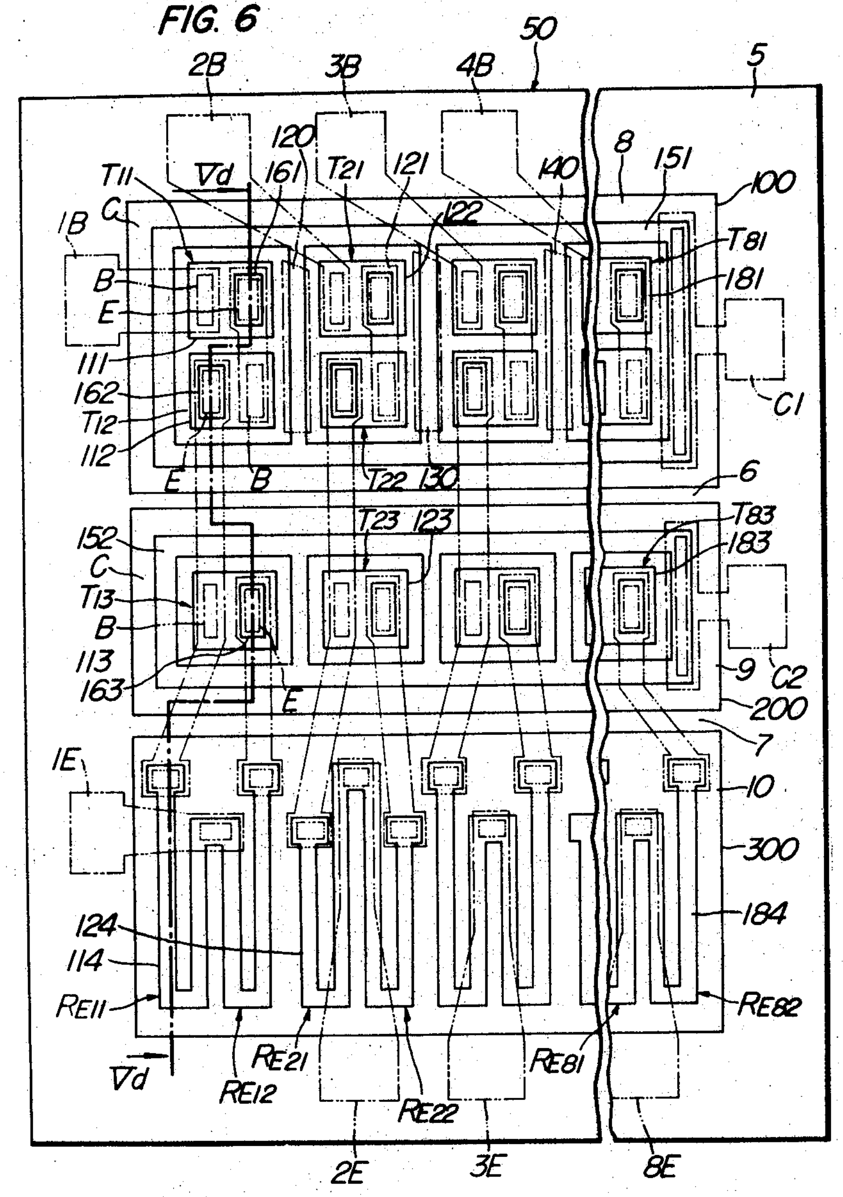

FIGS 5*a* to 5*d*, and FIG. 6 shows an integrated switching circuit device according to one embodiment of this invention. FIGS. 5*a* to 5*d* show cross-sections of a semiconductor substrate in each manufacturing step. FIG. 6 is a plane view of the semiconductor substrate embodying the above switching device. FIG. 5*d* shows a cross-section along the line V*d*—V*d* of FIG. 6.

A type of prior art switching device using a semiconductor device is shown in FIG. 1, in which a gating circuit consisting of a voltage source $V_{c1}$, a transistor $T_1$, bias resistors $R_1$ and $R_2$, a load resistor $R_3$ and an emitter resistor $R_4$, and a control signal circuit or a bias controlling circuit consisting of a resistor $R_5$, a key switch K, a voltage sourve $V_{c2}$ and a timing circuit (a capacitor $C_1$ and a resistor $R_6$) producing the sustain effect, are comprised.

In this figure, the transistor $T_1$ forms a common emitter circuit. Signals from a tone generator S are constantly applied to the base of the transistor $T_1$. As occasion demands, the key switch K directly connected to the keyboard is closed to make transistor $T_1$ conducting and a desired signal is derived from the output terminal OUT.

A large number of such switching devices are provided corresponding to the number of keyboards in an electronic instrument. This increases the mounting and soldering steps involved in making the instrument. Further increases in number of fitting points of a component results in reducing the reliability of the obtained instrument. It is desirable, therefore, to form such a switching device into a semiconductor integrated circuit. However, in the prior art circuit arrangement the area occupied by the gating circuit 2 when integrated in a semiconductor circuit becomes large owing to the high bias resistors $R_1$ and $R_2$. Specifically in the case of an electronic organ, a large number of gating circuits corresponding to the number of keys has to be integrated in a semiconductor chip. So, the area occupied by a gating circuit should be as small as possible.

A semiconductor integrated switching device requires a more severe reliability in comparison with a switching device composed of individual components. However, in the prior art circuit arrangement the reverse breakdown voltage between the base and the emitter is low so that the transistor is liable to breakdown. For example, in FIG. 1, when the key switch K is open, the emitter voltage of the transistor $T_1$ is nearly $+V_{c2}$. At the same time an input signal from the tone generator S changes the base potential of the transistor $T_1$ to earth potential so that a voltage in excess of the reverse breakdown voltage is applied between the base and the emitter, causing a breakdown of the transistor.

Further in the prior art device the capacitance $C_{ob}$ between the collector and the base causes a leakage output signal, which decreases the level ratio between the output sigals during operating (K closes) and non-operating time (K open). Then, even if the key is not pushed, a signal tone from the tone generator is applied to the final output state, i.e. the speaker, through the collector capacitance $C_{ob}$, and heard as a noise even in the absence of performance.

Hereafter we will explain one embodiment of this invention, from which it will be seen that an integrated circuit device can be utilized effectively.

Figure 4:
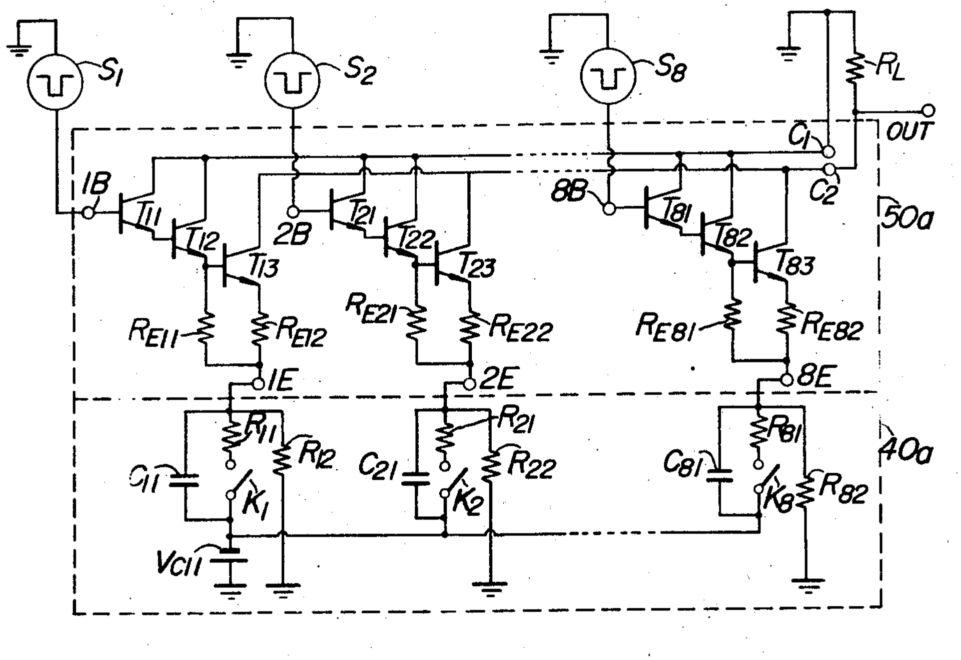

In FIG. 6, and in FIG. *5d* showing a cross-section along the line V*d*—V*d* of FIG. 6, where like reference numerals are used to denote like parts as shown in FIG. 6, an integrated switching device according to one embodiment of this invention is shown. In these two figures, some portions of the switching device are omitted. In FIG. 4, where like reference numerals are used to denote like parts as shown in FIGS. 6 and *5d*, an electric circuit of the switching device comprising the portion corresponding to the one shown in FIGS. 6 and *5d*, i.e. the portion surrounded by the broken line $\mathbf{50}_a$, is shown.

This switching device, as shown in these figures, comprises a semiconductor substrate 50 of one conductivity type and first, second and third semiconductor regions 8, 9 and 10 of the other conductivity type formed in the substrate 50. These three regions are separated electrically from the substrate by PN junctions 100, 200 and 300 respectively. In the first region, eight pairs of transistors $T_{11}$ and $T_{12}$, $T_{21}$ and $T_{22}$ . . . and $T_{81}$ and $T_{82}$ in Darlington connection, i.e. sixteen transistors $T_{11}$, $T_{21}$ . . . $T_{81}$, and $T_{12}$, $T_{22}$ . . . $T_{82}$ are formed. In the second region, eight transistors $T_{13}$, $T_{23}$ . . . $T_{83}$ are formed with their collectors connected in common. In the third region, eight resistor layers 114, 124 . . . 184 are formed. The bases of eight transistors $T_{11}$, $T_{21}$ . . . $T_{81}$ are connected with input terminals $1_B$, $2_B$ . . . $8_B$ respectively. Pairs of emitter resistors $R_{E11}$ and $R_{E12}$, $R_{E21}$ and $R_{E22}$ . . . $R_{E81}$ and $R_{E82}$ are obtained by connecting the base of the resistor layers 114, 124 . . . 184 between the base and the emitter of transistors $T_{13}$, $T_{23}$ . . . $T_{83}$ respectively. Control signal terminals 1E, 2E . . . 8E are led out from the nearly center portions of the respective resistor layers. A plurality of transistors in the first region 8 form eight Darlington circuits by connecting the emitters of transistors $T_{11}$, $T_{21}$ . . . $T_{81}$ with the bases of transistors $T_{12}$, $T_{22}$ . . . $T_{82}$ respectively. The collector regions of these transistors are connected in common and led to the terminal $C_1$ to be grounded through a ladder-like low resistivity region 151. The collector regions of eight transistors in the second reigon 9 are also connected in common and led to a terminal $C_2$ to be connected to a load resistor $R_L$ through a ladder-like low resistivity region 152. The emitters of transistors $T_{12}$, $T_{22}$ . . . $T_{82}$ are connected to the bases of transistors $T_{13}$, $T_{23}$ . . . $T_{83}$ respectively by conducting layers. Thus a plurality of transistor combinations $T_{11}$ to $T_{13}$, $T_{21}$ to $T_{23}$ . . . and $T_{81}$ to $T_{83}$ form Darlington circuits with the collectors of transistors $T_{13}$, $T_{23}$ and $T_{83}$ separated from the collection of transistors pairs $T_{11}$ and $T_{12}$, $T_{21}$ and $T_{22}$, and $T_{81}$ and $T_{83}$. As a result, eight gating circuits as shown by the broken line 50*a* in FIG. 4 are fixed in a semiconductor substrate.

Next, the manufacturing method of the switching device according to this invention will be explained with reference to FIGS. *5a* to *5d* and FIG. 6 following the manufacturing steps.

First, as shown in FIG. *5a*, a semiconductor substrate 50 is prepared. This substrate 50 is formed by an $N^+$ type silicon layer 30 (having a thickness of e.g. $4\mu$) and an N type silicon layer 40 (having a thickness of e.g. $10\mu$) successively grown by the epitaxial technique on one surface of a $P^-$ type silicon semiconductor wafer 20 (having a thickness of e.g. $200\mu$).

Next, as shown in FIG. *5b*, P type layers 5, 6 and 7 are formed in the selected portions of the substrate 50 using the diffusion technique with a silicon oxide film 18 as a selective mask. Thus, three N type regions 8, 9 and 10 are electrically insulated from each other by PN junctions 100, 200 and 300 (see FIG. 6).

As shown in FIG. *5c*, using the diffusion technique with the oxide film 18 as a selective mask P type regions 111 and 112, and 113 are formed in the N type regions 8 and 9 respectively to form the base regions, and a P type region 114 is formed in the N type region 10 to form a resistor layer. In this case, the number of P type regions 111 formed in the region 8 is determined by the number of transistors connected in Darlington manner in the gating circuit and the number of keys. In this embodiment, as shown in this figure, the number of transistors to be connected in Darlington manner is two and the number of keys is eight so that sixteen transistors are formed in the region 8. The number of P type regions 113 formed in the region 9 is equal to the number of gating circuits, namely eight.

The resistor region 114 formed in the region 10 serves as the emitter registers $R_{E11}$ and $R_{E12}$ of the transistors $T_{12}$ and $T_{13}$ formed in the regions 8 and 9 respectively.

As shown in FIG. *5d*, using the diffusion technique, N type regions 161, 162 and 163 are formed in the P type regions 111, 112 and 113 respectively to make emitter regions, and $N^+$ type regions 151 and 152 are formed to make a part of the regions 8 and 9 highly doped collector layers. Thus, as shown in FIG. *5d* NPN type transistors $T_{11}$ and $T_{12}$ are formed in the region 8 while an NPN transistor $T_{13}$ is formed in the tregion 9. Practically, other transistors are formed simultaneously with the transistors $T_{11}$, $T_{12}$ and $T_{13}$ in regions 8 and 9 at the same time.

Thereafter, as shown in FIG. *5d*, the oxide film 18 is partially removed to lead out electrodes. As shown by broken lines in FIG. 6, through the use of aluminum evaporation and photoengraving techniques, mutual wiring paths among electrodes and necessary terminals are formed. In this case, conducting layers 120, 130 and 140 may be formed to decrease the resistance component existing from the collector junctions to the terminal $C_1$.

As evident from the above explanation, according to one example of this invention, a plurality of transistors constituting a gating circuit are arranged in the regions 8 and 9 in one direction with a constant width therebetween and connected by mutual connection lines extending towards the perpendicular direction with respect to the direction of the above transistors. So, it is possible to dispose the group of base input terminals $1_B$, $2_B$, $3_B$ . . . opposed to the group of terminals $1_E$, $2_E$, $3_E$ . . . to which the key switches are to be connected. Further, in the electrically separated regions 8 and 9 (hereafter referred to simply as isolated regions) highly doped regions 151 and 152 extend respectively as a collector electrode. So, it is possible to provide easily a collector earth terminal $C_1$ and the load resistor connecting terminal $C_2$ on arbitrary portions distant from the portions where a group of base input terminals and a group of key switch connecting terminals exist. As a result, the wiring structure among elements and that between the integrated device and an externally led out electrode are easily made.

Moreover, according to this invention, the occupied area of an isolated region (e.g. the region 8) can be large and hence there is no need of preparing many such isolated regions. So, the packing density of elements can be increased. Although for the sake of convenience eight or sixteen transistors are shown to be incorporated in an isolated region, it is apparent that much more transistors may be formed therein if necessary.

Further, according to this invention, it is not necessary to form a high resistor such as a bias resistor. Since transistors having a smaller area than that of the resistor elements are mainly comprised, high density mounting of transistors become possible. Therefore, it is possible to mount many gating circuits in a single semiconductor wafer.

Although in the above embodiment the isolation is effected by a PN junction, an insulating film such as an $SiO_2$ film may be used therefor. This invention is not limited to the isolation by means of a PN junction.

FIG. 4 shows a switching device of an electronic organ using the integrated circuit thus obtained (the portion surrounded by the broken line 50*a*). In this figure, $S_1$, $S_2$ . . . $S_8$ show tone generators generating rectangular wave signals having different frequencies. $R_L$ is a load resistor having an output terminal OUT. The circuit portion surrounded by the broken line 40*a* is a control signal circuit comprising resistors $R_{11}$, $R_{21}$ . . . $R_{81}$ controlling the rise time, a voltage source $V_{c11}$, key switches $K_1$, . . . , $K_8$ which respond to the keys on a keyboard, and a plurality of time constant circuits (consisting of the CR groups of $C_{11}$ and $C_{12}$, $C_{21}$ and $R_{22}$ . . ., $C_{81}$ and $R_{82}$) to obtain the sustain effect. A gating circuit corresponding to a key switch operates by pushing an arbitrary key switch (i.e. closing the switch), and a signal from the tone generator connected to the input terminal of the gating circuit appears at the output terminal OUT. By closing the key switches $K_2$ and $K_8$ a composite signal (a mixed signal) of the signals from the generators $S_2$ and $S_8$ appears simultaneously at the output terminal OUT.

The action of the circuit shown in FIG. 4 will be described in more detail hereinafter with reference to FIG. 2, where one gating circuit is shown in particular. The circuit shown in FIG. 4 operates satisfactorily with such circuit constants as shown in FIG. 2, which are however merely exemplary.

In comparison with the circuit shown in FIG. 1 the characteristics of the circuit in FIG. 2 lie in the fact that the transistors $T_{11}$ and $T_{12}$ are in Darlington connection with their common collector grounded and that in order to separate the collectors of transistors $T_{12}$ and $T_{13}$ a load resistor $R_L$ is inserted in the collector side of the output stage transistor connected directly to the transistor $T_{12}$ thereby forming a so-called collector separated type Darlington circuit. The circuit 50*b* is a gating circuit comprising three transistors $T_{11}$, $T_{12}$ and $T_{13}$. The circuit 40*b* is a control signal circuit supplying a gate signal to the gating circuit.

In such a circuit arrangement, a signal $e_s$ from the tone generator is continuously applied at the input terminal IN. When the key switch $K_1$ directly connected to the key is open, the transistors $T_{11}$, $T_{12}$ and $T_{13}$ are non-conducting. The gain of the transistor $T_{13}$ is zero, no signal appearing substantially at the output terminal OUT. In this case the input signal is grounded through the collector-base capacitances $C_{ob1}$ and $C_{ob2}$ of the transistors $T_{11}$ and $T_{12}$ and attenuated by these transistors having a high impedance. Thus, the signal is hardly transmitted to the base of the transistor $T_{13}$. As a result, the leakage signal level appearing at the output terminal OUT can be decreased very much to improve the switching ratio.

When the key switch $K_1$ is open, a voltage is applied between the input terminal IN and the emitter of the output transistor $T_{13}$ to give the emitter a reverse bias. Since the emitter-base channels of the three transistors are connected in series, the voltage applied at the PN junction between the base and the emitter of each transistor may be ⅓ of the case with one transistor. So, each transistor becomes hard to break down.

When a desired musical scale is wanted, the key switch $K_1$ is closed whereby the transistors $T_{11}$, $T_{12}$ and $T_{13}$ become conducting. The signal $e_s$ from the tone generator is transmitted to the output terminal OUT as a signal $e_o$.

The emitter resistors $R_{E11}$ and $R_{E12}$ do not only act to stabilize the bias, but to reduce remarkably the signal applied at the output transistor $T_{13}$ during the cut-off period of transistors $T_{11}$, $T_{12}$ and $T_{13}$, thereby further improving the switching ratio.

As described above, the circuit arrangement adopted by this invention is characterized in that a plurality of transistors are connected in the form of collector separated Darlington connection with their collectors grounded. The switching ratio is increased, and a breakdown of the emitter junction is prevented without using any high bias resistor.

Figure 3C:
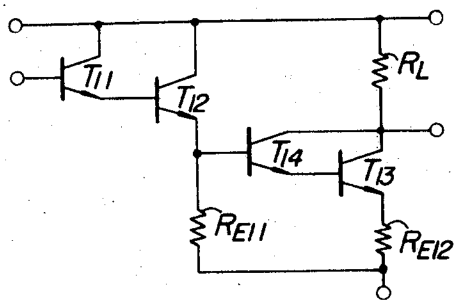

Although the above description has been made of a switching device comprising a plurality of integrated gating circuits consisting of three transistors, it is needless to say that as shown in FIG. 3*a* another transistor $T_{14}$ may be added to use in total four transistors. In this case, the switching ratio and the emitter breakdown voltage are remarkably improved. In order to obtain a similar effect a diode $D_1$ may be inserted as shown in FIG. 3*b*. Further, as shown in FIG. 3*c*, it may be good to connect the output transistors $T_{13}$ and $T_{14}$ in Darlington manner. These modifications encounter no particular difficulty. Through the use of the above-mentioned or publicly known integration method an excellent switching device can be obtained simply.

Other minute modifications may be made easily by those skilled in the art without departing from the scope of the appended claims.

What is claimed is:

1. A switching device comprising a semiconductor body having first and second semiconductor regions electrically separated from each other, formed in one principal surface thereof and having the same conductivity type; a plurality of first transistors formed in said first region, each of the first transistors including said first region as its collector region, a base region formed in said first region and having a conductivity type opposite to that of said first region and an emitter region formed in said base region and having the same conductivity type as that of said first region, said base regions being spaced from each other while their collector regions being connected in common; a plurality of second transistors having the same number as that of said first transistors and formed in said second region, each of the second transistors including said second region as its collector region, a base region formed in said second region and having a conductivity type opposite to that of said second region and an emitter region formed in said base region of the second transistor and having the same conductivity type as that of said second region, said base regions of the second transistors being spaced from each other while their collector regions being connected in common; a plurality of first conducting means each for connecting one of the emitter regions of said first transistors with the corresponding one of the base regions of said second transistors; a plurality of first input terminals each electrically connected to the corresponding one of the base regions of said first transistors; a second terminal electrically connected to the common collector region of said first transistor; a plurality of third terminals each electrically connected to the corresponding one of the emitter regions of said first and second transistors; and a fourth terminal electrically connected to the common collector region of said second transistors.

2. A switching device according to claim 1, further comprising a plurality of third transistors having the same number as that of said first transistors and formed in said said first region, each of the third transistors including said first region as its collector region, a base region formed in said first region and having the conductivity type opposite to that of said first region and an emitter region formed in the base region of the third transistor and having the same conductivity type as that of said first region, said base regions of the third transistors being spaced from each other and from said base regions of said first transistors while the collector regions of the third transistors being connected in common with each other and with the collector regions of said first transistors; and a plurality of second conducting means each for connecting one of the emitter regions of said third transistors with the corresponding one of the base regions of said first transistors thereby said third transistors constituting Darlington circuits with said first transistors; said plurality of first input terminals being electrically connected to the corresponding base regions of said third transistors, respectively.

3. A switching device according to claim 1, further comprising a third semiconductor region electrically separated from said first and second regions and formed in said principal surface of said body; a plurality of resistor layers each having two end portions and formed in said third region, the number of said plurality of resistor layers being the same as that of said second transistors; a plurality of second conducting means each for connecting one of said end portions of one of said resistor layers with the corresponding one of the emitter regions of said first transistors, and a plurality of third conducting means each for connecting the other of said end portions of said one of the resistor layers with the corresponding one of the emitter regions of said second transistors; each of said plurality of third terminals being fitted to a portion between said two end portions of the corresponding one of the resistor layers.

4. A switching device comprising a semiconductor substrate of first conductivity type having one principal surface; first, second and third semiconductor regions of second conductivity type which are separated electrically from one another by PN junctions; a plurality of first transistors formed in said first region, each of the first transistors including said first region as its collector region, a base region of said first conductivity type formed in said first region and an emitter region of said second conductivity type formed in said base region, said base regions being spaced from each other while their collector regions being connected in common; a plurality of second transistors having the same number as that of said first transistors and formed in said second region, each of the second transistors including said second region as its collector region, a base region of said first conductivity type formed in said second region and an emitter region of said second conductivity type formed in said base region, said base regions of the second transistors being spaced from each other while their collector regions being connected in common; a plurality of resistor layers formed in said third region and having two end portions, the number of resistor layers being equal to that of said second transistors; a plurality of first input terminals electrically connected to the individual base regions of said first transistors; input signal sources connected to the individual first terminals; a plurality of first conducting means for connecting each of the emitter region of said first transistors to the corresponding base regions of said second transistors; a second conducting means for connecting the common collector region of said first transistors to a reference voltage point; a plurality of third conducting means for connecting one end portion of each of said resistor layers with the corresponding emitter regions of said first transistors; a plurality of fourth conducting means for connecting the other end portion of each of said resistor layers with the corresponding emitter regions of said second transistors; a second terminal electrically connected to the common collector region of said second transistors; a plurality of third terminals fitted to a portion between said two end portions of the corresponding resistor layers; a load impedance connected between said second terminal and said reference voltage point; and a plurality of control circuits connected between the corresponding third terminals and said reference voltage point.

5. A switching device according to claim 4, wherein said control circuits include a voltage source one terminal of which is connected to said reference voltage, a plurality of switching means connected between the other terminal of said voltage source and the corresponding third terminals, a plurality of electric capacitors connected in parallel with said plurality of switching means, and a plurality of resistors connected between said third terminals and said reference voltage point.

6. A switching device comprising a semiconductor substrate of first conductivity type having one principal surface; first, second and third semiconductor regions of second conductivity type which are separated electrically from one another by PN junctions; a plurality of first transistors formed in said first region, each of the first transistors including said first region as its collector region, a base region of said first conductivity type formed in said first region and an emitter region of said second conductivity type formed in said base region, said base regions being spaced from each other while their collector regions being connected in common; a plurality of second transistors having the same number as that of said first transistors and formed in said second region, each of the second transistors including said second region as its collector region, a base region of said first conductivity type formed in said second region and an emitter region of said second conductivity type formed in said base region, said base regions of the second transistors being spaced from each other while their collector regions being connected in common; a plurality of resistor layers formed in said third region and each having two end portions, the number of resistor layers being equal to that of said second transistors; a plurality of first input terminals each electrically connected to the corresponding one of the base regions of said first transistors; input signal sources each connected to the corresponding one of the first terminals; a plurality of first conducting means each for connecting one of the emitter regions of said first transistors to the corresponding one of the base regions of said second transistors; a second conducting means for connecting the common collector region of said first transistors to a reference voltage point; a plurality of third conducting means each for connecting one end portion of one of said resistor layers with the corresponding one of the emitter regions of said first transistors; a plurality of fourth conducting means each for connecting the other end portion of said one of said resistor layers with the corresponding one of the emitter regions of said second transistors; a second terminal electrically connected to the common collector region of said second transistors; a plurality of third terminals each fitted to a portion between said two end portions of the corresponding one of the resistor layers; a load impedance connected between said second terminal and said reference voltage point; and a plurality of control circuits each connected between the corresponding one of the third terminals and said reference voltage point.

7. A switching device according to claim 6, wherein said control circuits include a voltage source one terminal of which is connected to said reference voltage, a plurality of switching means each connected between the other terminal of said voltage source and the corresponding one of said third terminals, a plurality of electrical capacitors each connected in parallel with the corresponding one of said plurality of switching means, and a plurality of resistors each connected between the corresponding one of said third terminals and said reference voltage point.

References Cited

UNITED STATES PATENTS

| | | | |
|---|---|---|---|
| 2,663,806 | 12/1953 | Darlington | 307—88 |
| 2,663,830 | 12/1953 | Oliver | 317—235 |
| 3,103,599 | 9/1963 | Henkels | 307—88.5 |
| 3,209,214 | 9/1965 | Murphy et al. | 317—234 |
| 3,210,677 | 10/1965 | Lin et al. | 330—17 |
| 3,263,178 | 7/1966 | Nowalk | 330—30 |

JERRY D. CRAIG, Primary Examiner

U.S. Cl. X.R.

307—303, 315